US006292034B1

(12) United States Patent
Koifman et al.

(10) Patent No.: US 6,292,034 B1
(45) Date of Patent: Sep. 18, 2001

(54) LOW NOISE TRANSCONDUCTANCE DEVICE

(75) Inventors: Vladimir Koifman, Rishon-Lezion; Yachin Afek, Cfar-Sabe, both of (IL)

(73) Assignee: Motorola Inc., Schaumburg, IL (US)

( * ) Notice: Subject to any disclaimer, the term of this patent is extended or adjusted under 35 U.S.C. 154(b) by 0 days.

(21) Appl. No.: 09/512,172

(22) Filed: Feb. 24, 2000

(51) Int. Cl.$^7$ .................................................. H03L 5/00
(52) U.S. Cl. .............................................. 327/103; 327/563
(58) Field of Search ................................... 327/103, 560, 327/561, 562, 563

(56) References Cited

U.S. PATENT DOCUMENTS

| 4,264,871 | 4/1981 | Forward | 330/149 |
|---|---|---|---|
| 5,552,729 | * 9/1996 | Deguchi | 327/103 |
| 6,005,431 | * 12/1999 | Mehr et al. | 327/307 |
| 6,101,561 | * 8/2000 | Beers et al. | 710/66 |
| 6,134,473 | * 10/2000 | Hemming et al. | 607/28 |
| 6,163,287 | * 2/2000 | Huang | 341/143 |
| 6,166,592 | * 12/2000 | Walden | 327/562 |

* cited by examiner

Primary Examiner—Tuan T. Lam
(74) Attorney, Agent, or Firm—Robert L. King

(57) ABSTRACT

A low noise transconductance device having a transconduction comprising of two transconductive elements and a load, the transconduction of the first element equals N*Gm1, the transconduction of the second element equals Gm1/N, and a load having a resistance of 1/Gm1. The output of the first device is coupled to the input of the second element, and the load is coupled in parallel to the output of the first element. The accumulative transconduction of the device equals Gm1, and the noise generated by the device is lower than the noise generated by a single transconduction device having a gain of Gm1. N>2.

13 Claims, 1 Drawing Sheet

LOW NOISE TRANSCONDUCTANCE DEVICE

FIELD OF THE INVENTION

A low noise transconductance device and especially a low noise amplifier.

BACKGROUND OF THE INVENTION

Transcoductance devices and elements, such as transistors, are vastly used in modern electrical devices. MOS transistors can be found in almost every modern electronic device. Many transcoductance elements are used as amplifiers, and are adapted to receive a signal having a voltage level of Vin and generate an amplified output signal having a current level of Iout, Iout=Gm*Vin, Gm being the transcoductance of the device.

Amplifiers, and almost all known electrical circuits that have a resistive component generate an internal noise also referred to as thermal noise. This unwanted noise is random in nature and generally limits the amplifier performance. Noise is one of the major factors in a signal receiver or amplifier which limits the minimum detectable signal and thereby the information handling capacity of the apparatus. It is desirable, and in some cases critically so, that an amplifier and/or a transcoductance device generates a minimal degree of noise.

One of the methods for minimizing noise of amplifiers is matching a resistance of a signal source and an amplifier. U.S. Pat. No. 4,264,871 of Forward describes a circuit that has a source of electrical signals, being characterized by an inherent source resistance $R_S$; an amplifier having an input port, an output port, and an internal noise represented by an equivalent input noise voltage $V_N$, an equivalent input noise current $I_N$, and an equivalent input noise resistance $R_N$; and coupling means for matching said source to said amplifier to obtain optimum noise performance, said coupling means having a simulated resistance of: $A=-V_N R_S/(V_N - R_S I_N)$, such that the source resistance $R_S$ is matched to the noise resistance $R_N$.

A drawback of this method is that it does not try to diminish the noise generated by the amplifier but rather matches the noise to the signal source.

There is a need to provide an improved low noise amplifier and a low noise transcoductance device.

BRIEF DESCRIPTION OF THE DRAWINGS

While the invention is pointed out with particularity in the appended claims, other features of the invention are disclosed by the following detailed description taken in conjunction with the accompanying drawings, in which

DETAILED DESCRIPTION OF THE DRAWINGS

The invention provides a plurality of elements such as transconductive elements and load elements that generate a very low noise. This plurality of elements is coupled together and provides a lower noise level than a single transconductive device having a gain that equals the accumulative gain of the plurality of elements.

Especially, the invention provided a device comprising of two transconductive elements and a load, the transconduction of the first element equals N*Gm1, the transconduction of the second element equals Gm1/N, and a load having a resistance of 1/Gm1. The output of the first device is coupled to the input of the second element, and the load is coupled in parallel to the output of the first element. The accumulative transconduction of the device equals Gm1 and the noise generated by the device is lower than the noise generated by a single transconduction device having a gain of Gm1.

Gm1 can be selected to provide a transconductive device that matches a signal source coupled to it.

Figure 1:
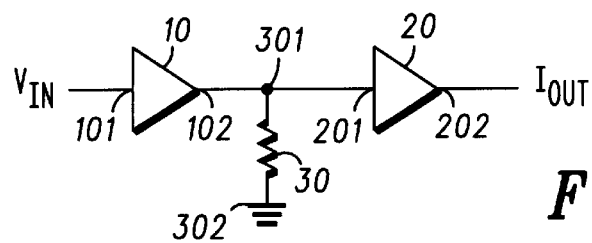
FIGS. 1–3 are schematic descriptions of low noise transconductance devices according to various preferred embodiments of the invention.

FIG. 1 is a schematic description of a low noise transconductive device 7 according to a preferred embodiment of the invention. The low noise transconductance device (i.e. DEVICE) includes: First transconductive element TC1 10, load L1 30 and second transconductive element TC2 20.

TC1 10 having output 102 and input 101, input 101 forms the input of the DEVICE. TC1 10 has a transconductance of Gm1*N, N>0, Gm1 is not equal to 0. L 30 having a resistance of 1/Gm1, has a first end 301 coupled to output 102 of TC1 10 and an opposite end 302 coupled to the ground. TC2 20 has an input 201 and an output 202. Output 202 of TC2 20 forms the output of the DEVICE. TC2 20 has a transconductance of Gm1/N. Input 201 of TC2 20 is coupled to output 102 of TC1 10.

TC1 10 receives input signal Vin and converts it into an output current Iout1. Iout1=Gm1*N*Vin. Conveniently, Gm1*N>1 meaning that Vin is amplified. The value of Gm1*N is related to the power consumption of TC1 10. Larger power consumption usually results in larger Gm1*N values. Typically, a transconductance of Gm1*N=1–10 $\mu$A/V is achieved when TC1 10 consumes 1$\mu$A.

Load L1 30 receives Iout 1 from TC1 10 and provides input 201 of TC2 20 Vin2, Vin2=Iout1*(1/Gm1)=Vin*Gm1*N*(1/Gm1)=Vin*N.

TC2 20 receives Vin2 and converts it to Iout, Iout=(Gm1/N)*Vin2=(Gm1/N)*Vin*N=Vin*Gm1. Thus current Iout, provided as an output signal of the DEVICE equals an input signal Vin multiplied by Gm1. The DEVICE has a transconductance of Gm1.

An advantage of the DEVICE is that it generates much less noise than a conventional transconductance device having transconductance of Gm1. Such a conventional transconductance device generates a noise having a spectral density of $\sqrt{(4*K*T*Y/Gm1)}$, while the DEVICE generates a noise having a spectral density of $$\sqrt{\frac{[(4*K*T*Y/(N*Gm1) + (4*K*T*Y/(N*N*Gm1) + (4*K*T*Y/(N*Gm1))]}{}} = \sqrt{(4*K*T*Y/Gm1)} * \sqrt{[(2/N)+(1/(N*N))]},$$

where K is Boltzmann's constant, T is temperature, and Y is a constant that is typically about 0.7 when a CMOS transistor is in a saturation mode. Thus the DEVICE generates less noise (by factor of $\sqrt{[(2/N)+(1/(N*N))]}$) than a prior art transconductive device having the same transconductance.

Preferably TC1 is an n-channel CMOS transistor, having a gate, a drain and a source, the gate having a polysilicon layer placed upon a gate oxide layer. A channel is formed within a substrate of the CMOS transistor and between the source and the drain. The transconductance of the CMOS transistor is proportional to a transconductance parameter KP, to a width W drawn of the gate of the CMOS transistor and is inversely proportional to an effective channel length Leff. KP is proportional to a surface mobility UO, to a dielectric constant of the gate oxide Eo and inversely proportional to thickness of the gate oxide layer Tox. Characteristic values of Eo are 30–150 aF/μm, of KP are 10–200 μA/V², of W drawn are 0.1–10 μm, of Leff are 0.1–5 μm, of UO are 500–650 cm²/Vs and of Tox are 10nm–0.1 μm.

Conveniently, N>2 and preferably 5<N<9. Conveniently, TC1 10 has a very high input resistance and an output resistance that substantially equals 50/Gm1. TC2 20 has a very high input resistance and an output resistance that ranges between (50*N)/Gm1 to (200*N)/Gm1. These features can be achieved when TC1 10 and TC2 20 are CMOS transistors, but it is not necessary.

Figure 2:
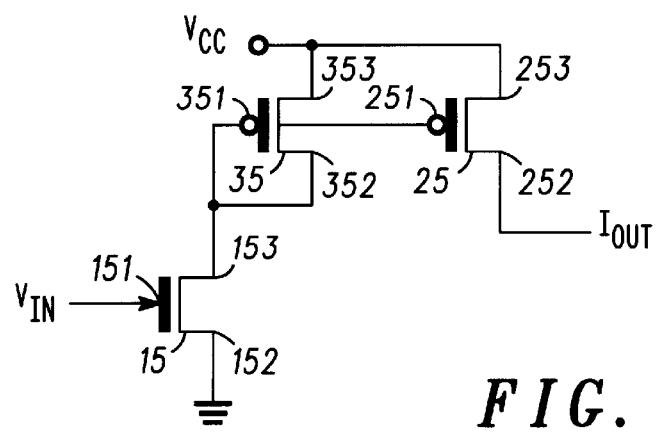

Referring to FIG. 2, TC1 10 is implemented by a first MOS transistor T1 15, TC2 20 is implemented by a second MOS transistor T2 25 and load L1 30 is implemented by a third MOS transistor T3 35. Transistors T1 15, T2 25 and T3 35 accordingly have gates G1 151, G2 251 and G3 351, accordingly have drains D1 153, D2 252 and D3 352, and accordingly have sources S1 152, S2 253 and S3 353 accordingly.

Gate G1 151 is adapted to receive input signal Vin (=Vgs1), source S1 152 is connected to the ground, drain D1 153 and gate G3 351 are coupled to gate G2 251 and drain D3 352. Source S2 253 and source S3 353 are connected to voltage supply Vcc, drain D2 252 provides the output signal Iout (=Id2). Transistor T1 15 has an n-channel, and transistors T2 25 and T3 35 have p-channels. T1 15 has a transconductance of Gm1*N, T2 25 has a transconductance of Gm1/N, and T3 35 has a transfer function (resistance) of 1/Gm1.

T1 15 receives Vin and converts it to a drain current Id1 that is substantially equal to a source current Is1 of S1 152. Is 1=Vin1*Gm1*N. T3 35 receives Is1 and converts it to a gate voltage Vg2, Vg2=Vg3=Is1*(1/Gm1). T2 receives Vg2 at gate G2 251 and converts it to an output current Iout= Id2=Vg2*Gm1/N=Vin*Gm1.

Figure 3:
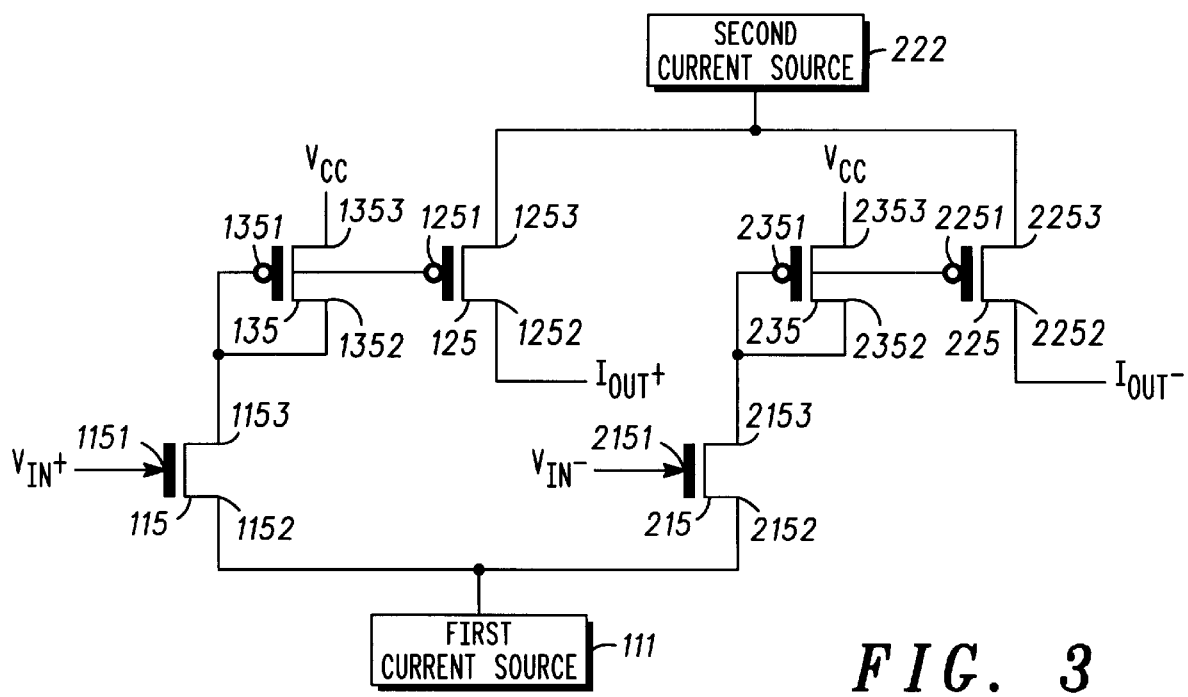

Referring to FIG. 3, the DEVICE is adapted to receive two input signals Vin+ and Vin− and to provide two output signals Iout+ and Iout−. The DEVICE of FIG. 3 has transconductance of Gm1, where (Vin+−Vin−)=Gm1* (Iin+−Iin−). Conveniently, the DEVICE of FIG. 3 amplifies a difference between the input signals (Vin+−Vin−).

TC1 10 is implemented by a first pair of MOS transistors 115 and 215, TC2 20 is implemented by a second pair of MOS transistors 125 and 225 and load L1 30 is implemented by a third pair of MOS transistors 135 and 235.

N-channel transistor 115 has a gate 1151, a source 1152 and a drain 1153. P-channel transistor 135 has a gate 1351, a source 1353 and a drain 1352. P-channel transistor 125 has a gate 1251, a source 1253 and a drain 1252. N-channel transistor 215 has a gate 2151, a source 2152 and a drain 2153. P-channel transistor 235 has a gate 2351, a source 2353 and a drain 2352. P-channel transistor 225 has a gate 2251, a source 2253 and a drain 2252.

Gate 1151 is adapted to receive a first input signal Vin+, drain 1152 and drain 2152 are connected to first current source 111, source 1153 and gate 1351 are connected to gate 1251; drain 1252 provides Iout+; source 1353 and source 2353 are connected to voltage supply Vcc, gate 2151 is adapted to receive a second input signal Vin−, drain 2153 and gate 2351 are connected to gate 2251 and drain 2352, source 2253 and source 1253 are connected to second current source 222. Drain 1252 provides a first output signal Iout+, and drain 2252 provides a second output signal Iout−.

Transistors 115, 125 and 135 of FIG. 3 are analogous to T1 15, T2 25 and T3 35 of FIG. 2. Transistors 215, 225 and 235 of FIG. 3 are analogous to T1 15, T2 25 and T3 35 of FIG. 2.

Transistors 115 and 215 receive two input signals Vin+ and Vin− and provide two drain currents and accordingly two source currents, whereas the difference between Vin+ and Vin− is proportional to a difference between the two source currents, (Is115−Is215)=(Gm1/N)*(Vin+−Vin−). Transistors 135 and 235 receive Is115 and Is215 and convert the currents to gate voltages Vg125 and Vg225 accordingly. Vg125=Vg135=Is115*(1/Gm1). Vg225=Vg235=Is12*(1/Gm1). Transistor 125 and transistor 225 receive Vg125 and Vg225 at gates 1251 and 2251 accordingly and converts them to output currents $$Iout+=Id135=Vg135*Gm1/N=(Vin+)*Gm1.$$

$$Iout-=Id235=Vg235*Gm1/N=(Vin-)*Gm1.$$

It should be noted that the particular terms and expressions employed and the particular structural and operational details disclosed in the detailed description and accompanying drawings are for illustrative purposes only and are not intended to in any way limit the scope of the invention as described in the appended claims.

Thus, there has been described herein an embodiment including at least one preferred embodiment of an improved transconductive device and an improved amplifier.

It will be apparent to those skilled in the art that the disclosed subject matter may be modified in numerous ways and may assume many embodiments other than the preferred form specifically set out and described above. Accordingly, the above disclosed subject matter is to be considered illustrative and not restrictive, and to the maximum extent allowed by law, it is intended by the appended claims to cover all such modifications and other embodiments which fall within the true spirit and scope of the present invention. The scope of the invention is to be determined by the broadest permissible interpretation of the following claims and their equivalents rather than the foregoing detailed description.

What is claimed is:

1. A transconductive device which minimizes noise, having an input and an output, the transconductive device comprising:

a first current source connected to a first node;

a first transconductive element connected to the first node, the first transconductive element having an output and an input, the input of the first transconductive element forms the input of the low noise transconductive device, the first transconductive element has a transconductance of Gm1*N, where N is a predetermined value greater than zero, and Gm1 is not equal to 0;

a load, having a resistance of 1/Gm1, the load having a first end coupled to the output of the first transconductive element and a second end coupled to a power supply terminal;

a second transconductive element, having an input and an output, the output of the second transconductive elements forms the output of the low noise transconductive device, the second transconductive element having a transconductance of Gm1/N; and wherein the input of the second transconductive element is connected to the output of the first transconductive element; and a second current source connected at a second node to the second transconductive element, the second current source providing a constant current to the second transconductive element while the voltage at the second node may vary as the output of the first transconductive element varies.

2. The device of claim 1 wherein the first transconductive element amplifies an input signal provided to the first transconductive element.

3. The device of claim 2 wherein the second transconductive element amplifies a signal that is provided to its input.

4. The device of claim 3 wherein the predetermined value of N is greater than two.

5. The device of claim 4 wherein the first transconductive element has an output resistance that substantially equals 50/Gm1; and wherein the second transconductive element has an output resistance that ranges between (50*N)/Gm1 to (200*N)/Gm1.

6. The device of claim 1 wherein the first transconductive element is a first MOS transistor T1, the second transconductive element is a second MOS transistor T2 and the load is a third MOS transistor T3.

7. The device of claim 6 wherein transistors T1, T2 and T3 have gates G1, G2 and G3 accordingly, have drains D1, D2 and D3 accordingly, and have sources S1, S2 and S3 accordingly;

gate G1 is adapted to receive an input signal, source S1 is connected to the first current source at the first node, drain D1 and gate G3 are connected to gate G2 and drain D3, source S2 is connected to second node, the second current source at the source S3 is connected to the power supply terminal, and drain D2 provides an output signal; and transistor T1 is has an n-channel, transistors T2 and T3 have p-channels.

8. The device of claim 1 wherein the device is adapted to receive a differential input signal and to generate a differential output signal.

9. The device of claim 8 wherein the first transconductive element is a first pair of MOS transistors T11 and T12, the second transconductive element is a second pair of MOS transistors T21 and T22 and the load is a third pair of MOS transistors T31 and T32.

10. The device of claim 9 wherein transistors T11, T12, T21, T22, T31 and T32 have gates G11, G12, G21, G22, G31 and G32 accordingly, have drains D11, D12, D21, D22, D31 and D32 accordingly, and have sources S11, S12, S21, S22, S31 and S32 accordingly;

wherein transistors T11 and T12 have n-channels, transistors T21, T22, T31 and T32 have p-channels;

wherein gate G11 is adapted to receive a first input signal, source S11 and source S12 are connected to the first current source, drain D11 and gate G31 are connected to gate G21 and drain D31, source S22 is connected to the power supply terminal, source 21 is connected to the second current source, gate G12 is adapted to receive a second input signal, drain D12 and gate G32 are connected to gate G22 and drain D32, source S32 is connected to the power supply terminal, and the source S22 is connected to the second current source;

wherein drain D21 provides a first output signal, drain D22 provides a second output signal; and wherein a difference between the first input signal and second input signal is proportional to a difference between the first output signal and second output signal.

11. The device of claim 1 wherein the device generates noise having a spectral density of $\sqrt{(4*K*T*Y/Gm1)}*\sqrt{[(2/N)+(1/(N*N))]}$.

12. A transconductive device comprising:

a first transistor of a first conductivity type having a first current electrode connected to a power supply terminal, and a control electrode connected to a second current electrode;

a second transistor of a second conductivity type having a first current electrode connected to the second current electrode of the first transistor, a control electrode for receiving an input signal, and a second current electrode;

a first current source having a terminal connected to the second current electrode of the second transistor;

a third transistor of the first conductivity type having a first current electrode, a control electrode connected to the control electrode of the first transistor, and a second current electrode for providing an output signal; and a second current source having a terminal connected to the first current electrode of the third transistor, the second current source providing a constant current to the first electrode of the third transistor as voltage at the first electrode of the third transistor varies in response to the input signal.

13. The transconductive device of claim 11 wherein the first conductivity type is P and the second conductivity type is N.

* * * * *